United States Patent
Lonsdale et al.

(10) Patent No.: US 6,304,020 B1
(45) Date of Patent: Oct. 16, 2001

(54) INTEGRATED ELECTRONIC STRUCTURE

(75) Inventors: Anthony Lonsdale; Bryan Lonsdale, both of Banbury (GB)

(73) Assignee: Transverse Technologies PLC, Bicester (*) Notice: Subject to any disclaimer, the term of this patent is extended or adjusted under 35 U.S.C. 154(b) by 0 days.

(21) Appl. No.: 09/297,985
(22) PCT Filed: Nov. 13, 1997
(86) PCT No.: PCT/GB97/03029
§ 371 Date: Jul. 29, 1999
§ 102(e) Date: Jul. 29, 1999
(87) PCT Pub. No.: WO98/21822
PCT Pub. Date: May 22, 1998

(30) Foreign Application Priority Data

Nov. 13, 1996 (AU) .................................... PO3588

(51) Int. Cl.⁷ ................................................ H03H 9/25
(52) U.S. Cl. ................................. 310/313 B; 310/313 R
(58) Field of Search ........................... 310/313 A, 313 B, 310/313 R, 348, 360

(56) References Cited

U.S. PATENT DOCUMENTS

| | | | | |
|---|---|---|---|---|
| 3,978,436 | * | 8/1976 | Alig et al. | 333/30 R |
| 3,982,113 | * | 9/1976 | Coldren | 235/181 |
| 4,392,115 | * | 7/1983 | Volluet et al. | 333/141 |
| 5,891,251 | * | 4/1999 | Taguchi et al. | 333/193 |

FOREIGN PATENT DOCUMENTS

05167384A * 10/1993 (JP) .................................. H03H/9/25

OTHER PUBLICATIONS

Japanese Abstract, vol. 017, No. 570 (E–1448), dated Oct. 15, 1993, & JP 05 167384 A (Hitachi Ltd), dated Jul. 2, 1993.

Japanese Abstract, vol. 005. No. 091 (E–061), dated Jun. 13, 1981 & JP 56 037722 A (Murata Mfg. Co., Ltd), dated Apr. 11, 1981.

* cited by examiner

*Primary Examiner*—Thomas M. Dougherty
(74) *Attorney, Agent, or Firm*—Davis & Bujold, P.L.L.C.

(57) ABSTRACT

An electronic structure comprising an electrically conductive base member with a layer of piezoelectric material bonded thereon, characterised in that at least first and second interdigital arrays are bonded or otherwise attached to said layer, in use said first interdigital array relying on the piezoelectric properties of said layer and said second interdigital array relying on the dielectric properties of said layer. Typically the first and second interdigital array forms part of at least one oscillator, such as a surface acoustic wave ('SAW') resonator, a shallow bulk acoustic wave ('SBAW') resonator, or the like. The second interdigital array forms part of at least one directional coupler such as a Lange coupler.

9 Claims, 1 Drawing Sheet

INTEGRATED ELECTRONIC STRUCTURE

TECHNICAL FIELD

This invention relates to an integrated electronic structure using piezoelectric material and bonded interdigital arrays. More particularly the invention is directed towards utilising different properties of the piezoelectric material to perform different functions within the same structure.

BACKGROUND ART

The process of using the piezoelectric properties of a material in combination with bonded electrodes in the form of interdigital arrays for the control or processing of electrical signals is well known. Surface acoustic wave ('SAW') devices such as resonators, delay lines, filters or convolvers are in widespread use throughout the world. The vast majority use quartz as the piezoelectric material, however other materials in use include directionally orientated zinc oxide and aluminium nitride. These devices are usually discrete devices in their own enclosure supported and connected to other components by a printed circuit board or wires.

The process of using the dielectric properties of a base material is also well known. Capacitors, inductors or high frequency transmission lines are often etched into printed circuit boards along with other conductive tracks. The dielectric properties of the base integrated electronic structure material of the printed circuit board is utilised in this case.

The object of this invention is to address the case where a number of electrical elements are needed in a circuit, some items requiring piezoelectric properties to function and some elements requiring dielectric properties to function.

SUMMARY OF INVENTION

The present invention is an integrated electronic structure comprising an electrically conductive base member with a layer of piezoelectric material bonded thereon, characterised in that at least first and second interdigital arrays are bonded to said layer, in use said first interdigital array relying on the piezoelectric properties of said layer and said second interdigital array relying on the dielectric properties of said layer.

Preferably said first interdigital array forms part of at least one oscillator, such as a surface acoustic wave ('SAW') resonator, a shallow bulk acoustic wave ('SBAW') resonator, or the like.

Preferably said second interdigital array forms part of at least one directional coupler such as a Lange coupler.

MODE OF CARRYING OUT INVENTION

Figures 1A, 1B:
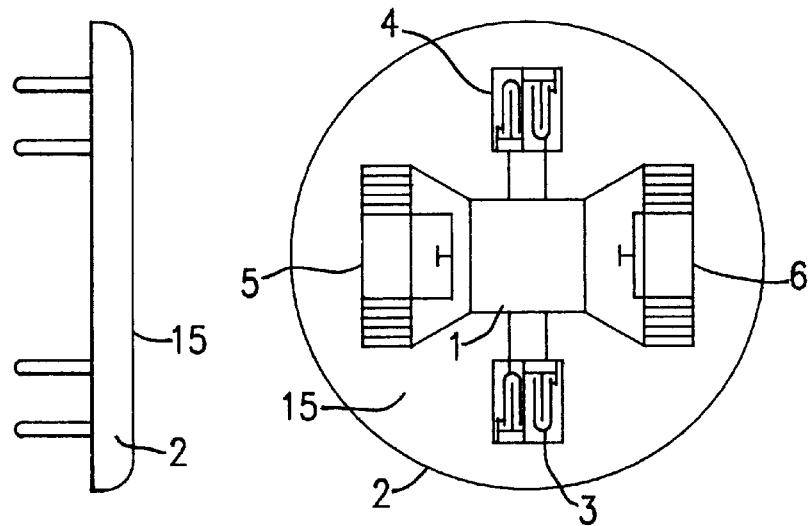
FIG. 1 shows a plan view of one embodiment of the invention.

FIG. 1 shows a plan view of one embodiment of the invention. Electrically conductive base member 2 has a layer 15 of piezoelectric material bonded thereon. Silicon chip electronic circuit 1 is attached to the centre of base member 2. SAW resonators 5 and 6 are formed on the surface of piezoelectric layer 15 by conductive interdigital arrays being vapour deposited on to this surface. SAW resonators 5 and 6 utilise the piezoelectric properties of the layer.

Lange couplers 3 and 4 are also formed on the surface of piezoelectric layer 15 by additional conductive interdigital arrays vapour deposited thereto. Lange couplers 2 and 3, although formed on the surface of a piezoelectric material, use only the dielectric, and not the piezoelectric, properties of the layer material. SAW resonators 5 and 6, and Lange couplers 2 and 3, are connected to silicon chip electronic circuit 1 by wire bonding or other suitable methods to create an operational circuit.

Figure 2:
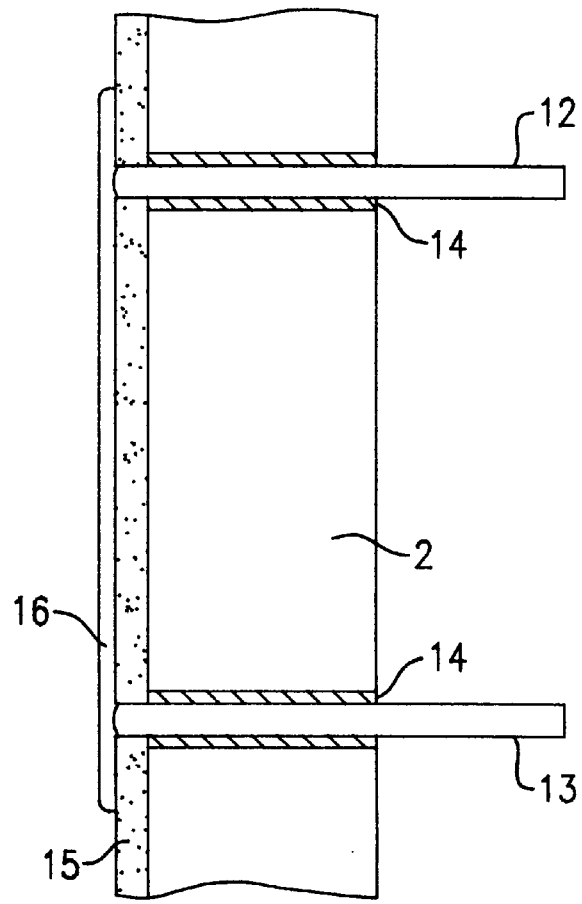
FIG. 2 shows a section through FIG. 1 indicating the layers and connections.

FIG. 2 is a cross section through the integrated electronic structure 15 showing electrically conductive base element 2 through which connection pins 12 and 13 are passed. The pins are insulated from the base element by a sealing and insulating material such as glass or glass like material with a suitable co-efficient of thermal expansion element 14. Piezoelectric layer 15 is bonded to base element 2, with the connection pins passing through the layer. Interdigital array 16 is vapour deposited on to piezoelectric layer 15 and makes electrical contact with connection pins 12 and 13.

The above described embodiment of an integrated electronic structure can be used as a component part in apparatus and method described in our two co-pending PCT Applications entitled 'Apparatus for Measuring Impedance of a Resonant Structure' and 'Apparatus for Tracking Resonant Frequency' both filed on the same date as the present application.

It will be recognised by persons skilled in the art that numerous variations and modifications may be made to the invention without departing from the spirit and scope of the invention.

What is claimed is:

1. An electronic structure comprising an electrically conductive base member having a layer of piezoelectric material bonded thereon, and the layer of piezoelectric material having both piezoelectric properties and dielectric properties;

wherein at least a first interdigital array and a second interdigital array are bonded to the layer of piezoelectric material on a surface of the layer of piezoelectric material opposite from the base member and, during operation of the electronic structure, the first interdigital array utilizes the piezoelectric properties of the layer of piezoelectric material and the second interdigital array utilizes the dielectric properties of the layer of piezoelectric material, and the first interdigital array and the second interdigital array form at least a portion of an oscillator; and the second interdigital array partially forms at least one directional coupler.

2. The electronic structure according to claim 1, wherein one of an inductive element and a capacitative element is attached to the layer of piezoelectric.

3. The electronic structure according to claim 1, wherein the oscillator is one of a surface acoustic wave resonator and a shallow bulk acoustic wave resonator.

4. The electronic structure according to claim 1, wherein the at least one directional coupler is a Lange coupler.

5. The electronic structure according to claim 1, wherein one of an inductive element and a capacitative element is attached to the layer of piezoelectric.

6. The electronic structure according to claim 3, wherein one of an inductive element and a capacitative element is attached to the layer of piezoelectric material.

7. An electronic structure comprising an electrically conductive base member having a layer of piezoelectric material bonded thereon, and the layer of piezoelectric material having both piezoelectric properties and dielectric properties;

wherein two first interdigital arrays and two second interdigital arrays are bonded to the layer of piezoelectric material on a surface of the layer of piezoelectric material opposite from the base member and, during operation of the electronic structure, the two first interdigital arrays utilize the piezoelectric properties of the layer of piezoelectric material and the two second interdigital arrays utilize the dielectric properties of the layer of piezoelectric material, and at least one of the two first interdigital arrays and at least one of the two second interdigital arrays form at least a portion of an oscillator; and at least one of the two second interdigital arrays at least partially forms a directional coupler.

8. The electronic structure according to claim 7, wherein the oscillator is one of a surface acoustic wave resonator and a shallow bulk acoustic wave resonator.

9. The electronic structure according to claim 7, wherein the oscillator is one of a surface acoustic wave resonator and a shallow bulk acoustic wave resonator.

* * * * *